(12) United States Patent
Nag et al.

(10) Patent No.: US 6,252,434 B1
(45) Date of Patent: Jun. 26, 2001

(54) VOLTAGE COMPARATOR

(75) Inventors: Manbir Nag, Coral Springs; Scott Robert Humphreys, Boynton Beach, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/593,378

(22) Filed: Jun. 15, 2000

Related U.S. Application Data

(63) Continuation of application No. 09/244,146, filed on Feb. 4, 1999.

(51) Int. Cl.[7] .................................................. H03K 5/22
(52) U.S. Cl. .............................. 327/65; 327/55; 327/57; 327/208
(58) Field of Search ............................. 327/50–55, 63–67, 327/69, 90, 560, 562, 563, 85, 199, 202, 203, 206, 208, 57

(56) References Cited

U.S. PATENT DOCUMENTS

| 4,602,167 | * | 7/1986 | Yukawa | 327/65 |
| 4,973,864 | * | 11/1990 | Nogami | 327/55 |
| 5,272,395 | * | 12/1993 | Vincelette | 327/63 |

* cited by examiner

Primary Examiner—Timothy P. Callahan
Assistant Examiner—Minh Nguyen
(74) Attorney, Agent, or Firm—Randi L. Dulaney

(57) ABSTRACT

A voltage comparator (10) includes a differential amplifier (12), a switched latch (32), and a switch (26). The voltage comparator (10) receives a first input signal (18) and a second input signal (20), and produces a first output (38) and a second output (40) by comparing the first and second input signals. A reset input (30) disables and enables the voltage comparator (10).

2 Claims, 2 Drawing Sheets

VOLTAGE COMPARATOR

This application is a continuation of U.S. application Ser. No. 09/244,146, filed Feb. 4, 1999.

FIELD OF THE INVENTION

This invention relates in general to electronic circuits, and in particular to voltage comparator circuits.

BACKGROUND OF THE INVENTION

Voltage comparator circuits are commonly used building blocks in electronic systems. A voltage comparator circuit provides an indication of whether one input voltage is higher or lower than a second input voltage. Today's portable electronic devices require low voltage, low power voltage comparator circuits for such functional blocks as analog to digital converters, low battery detection circuits, and the like.

A typical 2 volt comparator is discussed in the book *Delta-Sigma Data Converters—Theory, Design and Simulation* edited by Steven Norsworthy, Richard Schreier, and Gabor Temes of the IEEE Press 1997, and is illustrated on page 237. This comparator, exemplifying the typical circuitry utilized in today's communications circuits, comprises two cross-coupled latches and two switches.

The drawback of this circuit is that it operates at a minimum supply voltage of 2 volts, whereas low power portable systems today are moving to lower supply voltages.

Low voltage comparator circuits capable of 1 volt operation are being developed to meet the needs of these low power portable systems. One such design is discussed in an article entitled "A 900 MV 40 μW Switched Op amp Delta-Sigma Modulator with 77 dB Dynamic Range" by Vincenzo Peluso, et al., 1998 IEEE International Solid-State Circuits Conference, page 68. This article describes a circuit including a differential amplifier and a cross-coupled latch, with reset switches in parallel with the latch. The inputs are fed into a PMOS differential pair, limiting the input common-mode signal to the range GND to 0.25V. This reduced input operating range is a significant limitation over the range of operation of conventional 2 volt comparators, which usually have an input common-mode range of 1V. Thus, it would be preferable for a 1V comparator circuit to have a rail-rail (supply to ground) input common-mode operating range to have comparable performance to the 2V comparators.

What is needed, therefore, is a low voltage comparator capable of operating at a low supply voltage such as 1 volt, and over a wide input voltage range, for example from the supply voltage down to ground.

DESCRIPTION OF THE PREFERRED EMBODIMENT

Figure 1:
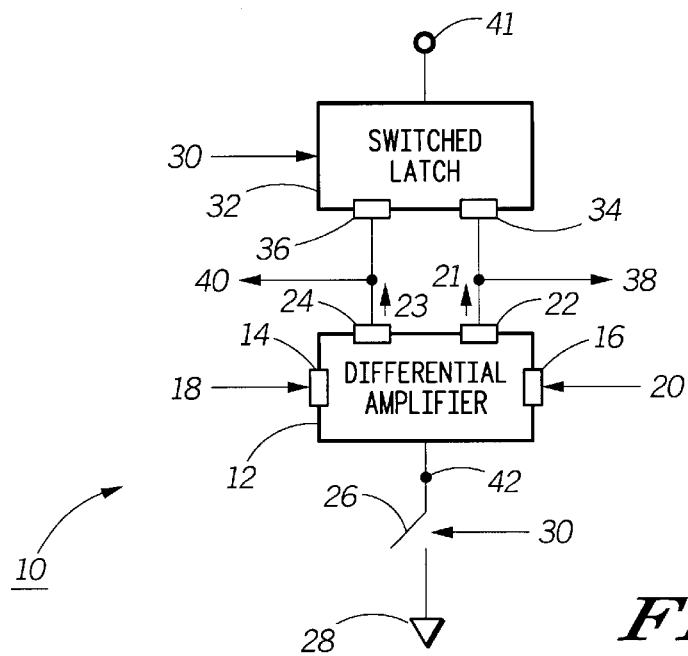
FIG. 1 is a block diagram of an electronic circuit for voltage comparison operating in accordance with the present invention.

Referring to FIG. 1, a block diagram of a voltage comparator 10 for voltage comparison of a first input signal 18 and a second input signal 20 is shown. The first input signal 18 and the second input signal 20 may be, for example, two signals at the output of the forward path gain circuit block in a sigma-delta subsystem or simply two voltage signals to be compared. The voltage comparator 10 is comprised of a differential amplifier 12, a switched latch 32, and a switch 26. The voltage comparator 10 compares the first input signal 18 and the second input signal 20 and produces a first output 38 and a second output 40. The first output and second outputs, 38 and 40 are digital signals having values of a logical one or zero. Because the voltage comparator 10 is a differential circuit, the first and second outputs, 38 and 40, are logical complements of each other.

The differential amplifier 12 operates to make a comparison of the first and second input signals 18 and 20. The differential amplifier 12 includes a first input 14 for receiving the first input signal 18, and a second input 16 for receiving the second input signal 20. A first amplifier output 22 of the differential amplifier 12 is a first current 21 proportional to the difference between the first input signal 18 and the second input signal 20. A second amplifier output 24 of the differential amplifier 12 is a second current 23 proportional to the difference between the second input signal 20 and the first input signal 18.

The switch 26 is coupled in series between the differential amplifier 12 and a ground 28. The switch 26 is responsive to a conventional reset input 30. When the reset input 30 is active, the switch opens, disabling current flow through the differential amplifier 12 When the reset input 30 is inactive, the switch closes, enabling current flow through the differential amplifier 12. Disabling the differential amplifier 12 during reset ensures that there is no contention on the first and second inputs 14 and 16, allowing the voltage comparator 10 to be reset when the reset input 30 is active while at the same time reducing the current drain of the circuit to zero.

The operation described above for the voltage comparator in accordance with the present invention results in a reduction of current drain over prior art by completely opening up the path between the supply and ground during reset, whereas the prior art draws current even during reset.

Figure 2:
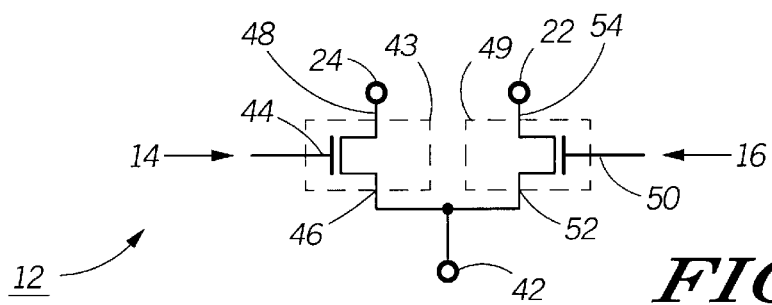
FIG. 2 is a schematic diagram of a N-differential amplifier utilized in the electronic circuit of FIG. 1.

As shown in FIG. 2, the differential amplifier 12 is preferably comprised of a first and a second N-channel field effect transistor (FET), 43 and 49. The first N-channel FET 43 has a gate 44 tied to the first input 14 to receive the first input signal 18. The first N-channel FET 43 also has a source 46 coupled to a switched ground 42; and a drain 48 tied to the second amplifier output 24. The second N-channel FET 49 has a gate 50 tied to the second input 16 to receive the second input signal 20. The second N-channel FET 49 also has a source 52 coupled to the switched ground 42; and a drain 54 tied to the first amplifier output 22.

Referring back to FIG. 1, the voltage comparator 10 also includes the switched latch 32 coupled in series between the differential amplifier 12 and a supply 41. The supply 41 is typically referred to as Vdd. The switched latch 32 is responsive to the reset input 30, which in the preferred embodiment is the same signal as that applied to switch 26. A first port 34 of the switched latch 32 is coupled to the first amplifier output 22 and a second port 36 of the switched latch 32 is coupled to the second amplifier output 24.

Figure 3:
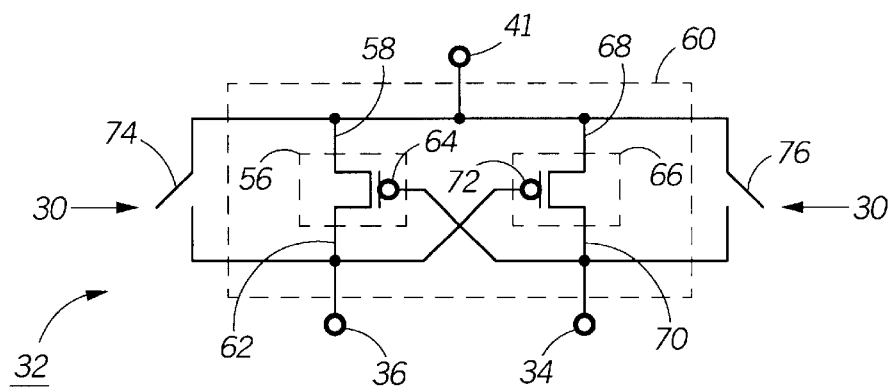
FIG. 3 is a schematic diagram of a switched latch utilized in the electronic circuit of FIG. 1.

As shown in FIG. 3, the switched latch 32 is preferably comprised of a first P-channel FET 56, a second P-channel FET 66, a first latch switch 74, and a second latch switch 76. The first P-channel FET 56 has a source 58 which is tied to the supply 41, a drain 62 and a gate 64. The second P-channel FET 66 has a source 68 which is tied to the supply 41, a drain 70 which is coupled to the gate 64 of the first P-channel FET 56, and a gate 72 which is coupled to the drain 62 of the first P-channel FET 56. As described, the first and second P-channel FETs, 56 and 66, form a cross-coupled latch 60. The cross coupling creates positive feedback or regeneration which not only allows the voltage comparator 10 to respond to its inputs in the nanosecond time frame, but also holds the result until the reset signal is re-activated.

The first latch switch 74 is coupled between the supply 41 and the drain 62 of the first P-channel FET 56. The second latch switch 76 is coupled between the supply 41 and the drain 70 of the second P-channel FET 66. The first and second latch switches, 74 and 76, form the reset circuitry. When the reset input 30 is active, the first port 34 and second port 36 are pulled up to the supply 41, also referred to as Vdd. When the reset input 30 is inactive, the first and second P-channel FETs, 56 and 66, of the switched latch 32 are enabled.

Preferably, the first output 38 of the voltage comparator 10 is coupled to the first port 34 of the switched latch 32 and to the first amplifier output 22 of the differential amplifier 12. Further, preferably the second output 40 of voltage comparator 10 is coupled to the second port 36 of the switched latch 32 and to the second amplifier output 24 of the differential amplifier 12.

The voltage comparator 10, as described above and shown in FIG. 1, operates such that the first output 38 is pulled up to supply (a logic 1 or an active state) and the second output 40 is pulled down to ground (a logic 0 or an inactive state) when the reset input 30 is inactive and the first input 14 is greater than the second input 16; and the second output 40 is pulled up to supply (a logic 1 or an active state)and the first output 38 is pulled down to ground (a logic 0 or an inactive state) when the reset input 30 is inactive and the second input 40 is greater than the first input 14.

Figure 4:
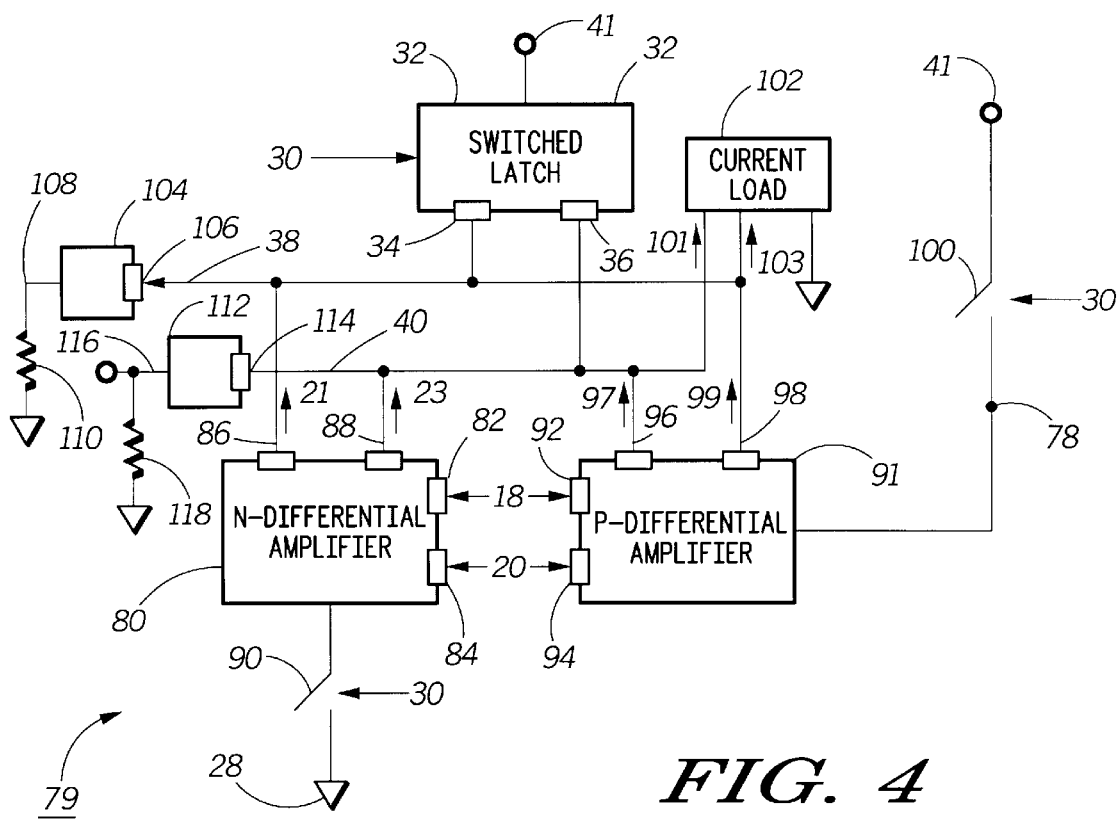
FIG. 4 is a block diagram of an alternative embodiment of the present invention.

Referring now to FIG. 4, a block diagram of a second voltage comparator 79 is shown. The voltage comparator 79 is comprised of an N-differential amplifier 80, a first switch 90, a P-differential amplifier 91, a second switch 100, a current load 102, and a switched latch 32. In a preferred embodiment, the voltage comparator 79 also comprises a first buffer 104 and a second buffer 112.

The N-differential amplifier 80 includes a first N-differential amplifier input 82 for receiving the first input signal 18, and a second N-differential amplifier input 84 for receiving the second input signal 20. A first N-differential amplifier output 86 of the N-differential amplifier 80 is the first current 21 proportional to the difference between the first input signal 18 and the second input signal 20. A second N-differential amplifier output 24 of the N-differential amplifier 80 is the second current 23 proportional to the difference between the second input signal 20 and the first input signal 18. The N-differential amplifier 80 operates to make a comparison of the first and second input signals when the average value (the common-mode) of these signals is equal to or greater than Vdd/2. The N-differential amplifier 80 is preferably similar to the circuit shown in FIG. 2 and described previously.

The first switch 90 is coupled in series between the N-differential amplifier 80 and the ground 28. The first switch 90 is responsive to the reset input 30, disabling the N-differential amplifier 80 when the reset input 30 is active; and enabling the N-differential amplifier 80 when the reset input 30 is inactive. Disabling the N-differential amplifier 80 during reset ensures that there is no contention on the first and second outputs 14 and 16, allowing the voltage comparator 10 to be reset when the reset input 30 is active while at the same time reducing the current drain to zero during reset operation.

As in the circuit of FIG. 1, the operation described above for the N-differential amplifier 80 results in a reduction in current drain over the prior art by completely opening up the path between supply and ground during reset, whereas the prior art draws current even during reset.

The P-differential amplifier 91 includes a first P-differential amplifier input 92 for receiving the first input signal 18 and a second P-differential amplifier input 94 for receiving the second input signal 20. A first P-differential amplifier output 96 is a third current 97 proportional to the difference between the second input signal 20 and the first input signal 18. A second P-differential amplifier output 98 is a fourth current 99 proportional to the difference between the first input signal 18 and the second input signal 20. The P-differential amplifier 91 operates to make a comparison of the first and second input signals when the common-mode of these signals is less than Vdd/2.

Figure 5:
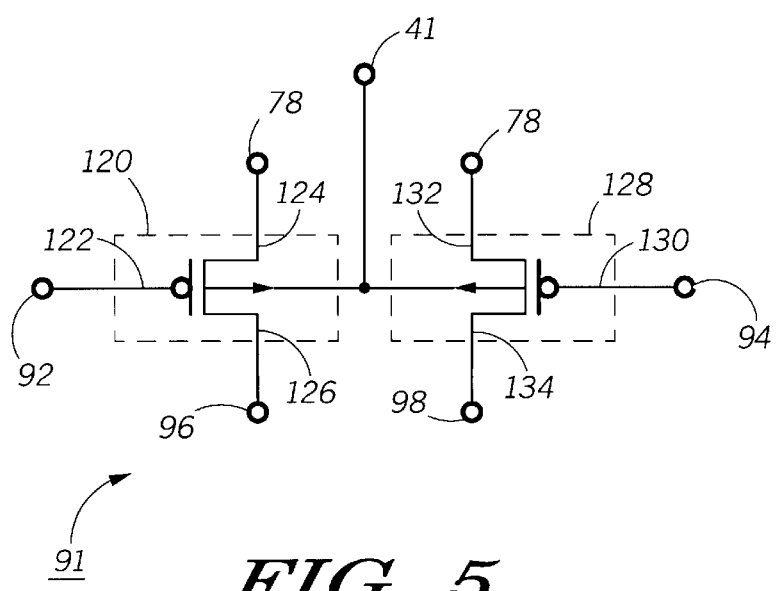
FIG. 5 is a schematic diagram of a P-differential amplifier utilized in the electronic circuit of FIG. 4.

As shown in FIG. 5, the P-differential amplifier 91 is preferably comprised of a first P-channel FET 120 and a second P-channel FET 128. The first P-channel FET 120 has a gate 122 which is coupled to receive the first input signal 18, a source 124 which is coupled to the switched supply 78, and a drain 126 which is tied to the second output 40. The second P-channel FET 128 has a gate 130 which is coupled to receive the second input signal 20, a source 132 which is coupled to the switched supply 78, and a drain 134 which is tied to the first output 38.

Referring back to FIG. 4, the second switch 100 is coupled in series between the P-differential amplifier 91 and the supply 41. The second switch 100 is responsive to the reset input 30, disabling the P-differential amplifier 91 when the reset input 30 is a active; and enabling the P-differential amplifier 91 when the reset input 30 is a inactive. Disabling the P-differential amplifier 91 during reset ensures that there is no contention on the first and second outputs 14 and 16, allowing the voltage comparator 10 to be reset when the reset input 30 is active while at the same time bringing the current drain to zero.

As in the N-differential amplifier 80, the operation described above for the P-differential amplifier 91 results in a reduction in current drain over the prior art by completely opening up the path between supply and ground during reset, whereas the prior art draws current even during reset.

The current load 102 is coupled to the first P-differential output 96 and to the second P-differential output 98. The current load draws a first load current 101 and a second load current 103. Preferably, the current load 102 is comprised of two resistors with a typical value of 150 kOhm, forming a class-AB load for the P-differential amplifier 91. Simulations have shown that this type of load is better than having a fixed current load because the resistive load naturally changes the load current in response to the voltage inputs 18 and 20. It is difficult for the P-differential amplifier 91 to generate a large enough current difference when using a fixed current load in order to trigger the cross-coupled latch 32. The value of the resistors chosen is a compromise between the current drain and the voltage drop needed across them in order to switch the cross coupled load. Depending upon whether or not the P-differential amplifier 91 is active, the resistor loads drain the appropriate amount of current, without restricting the proper operation of the voltage comparator 79. The current load 102 preferably is coupled through a switch to ground to float the resistor load during reset. This reduces the current drain during reset to zero.

Use of the P-differential amplifier 91 and the current load 102 allows the voltage comparator 79 to respond to input signals having a common-mode value anywhere from ground to supply (a rail-to-rail input common-mode range). As described above, the P-differential amplifier 91 and the N-differential amplifier 80 respond to input signals having common-mode values below or above Vdd/2, respectively. The current load 102 provides a sink current that pulls either the first or second output, 38 or 40, to ground when the input common-mode signal is below Vdd/2. (Under these conditions the N-differential amplifier 80 sinks very little current.) Thus the voltage comparator 79 as described above and in FIG. 4 operates with lower current drain and with a significantly wider input common-mode range than the prior-art while enabling operation at 1V.

The switched latch 32 is coupled to the P-differential amplifier 91 and the N-differential amplifier 80 and in series with the supply 41. The first port 34 of the switched latch 32 is coupled to the first N-differential amplifier output 86 and the second P-differential amplifier output 98. The second port 36 of the switched latch 32 is coupled to the second N-differential amplifier output 88 and the first P-differential amplifier output 96. The switched latch 32 is preferably comprised similarly to the circuit as shown in FIG. 3 and described previously.

Preferably, the first output 38 of the second electronic circuit 79 is coupled to the first port 34 of the switched latch 32, the first N-differential amplifier output 86, and the second P-differential amplifier output 98. Further, preferably the second output 40 of the second electronic circuit 79 is coupled to the second port 36 of the switched latch 32, to the second N-differential amplifier output 88, and the first P-differential amplifier output 96.

The voltage comparator 79, as described above and shown in FIG. 4, operates such that the first output 38 is pulled to supply (a logic 1 or an active state) and the second output 40 is pulled to ground (a logic 0 or an inactive state) when the reset input 30 is inactive and the first input 14 is greater than the second input 16; and the second output 40 is pulled to supply (a logic 1 or an active state) and the first output 38 is pulled to ground (a logic 0 or an inactive state) when the reset input 30 is inactive and the second input 40 is greater than the first input 14.

To ensure that the output currents 21 and 23 of FIG. 1 and 97, 99, 101, and 103 in FIG. 4 are equally loaded and to be able to drive low impedance loads, output buffers may be added to the voltage comparator 79. As shown in FIG. 4, a first buffer 104 includes a first buffer input 106 coupled to the first output 38 and a first buffer output 108 coupled to a first load 110. A second buffer 112 includes a second buffer input 114 coupled to the second output 40 and a second buffer output 116 coupled to a second load 118. These buffers stabilize the system enhancing reliability of the voltage comparator 79.

As is well known to those skilled in the art, a complementary design can be constructed by substituting P- or N-type devices for each of the N- or P-type devices, respectively, and by swapping the power and ground supply nodes.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. A voltage comparator for voltage comparison of a first input signal and a second input signal, and generating a first output and a second output, the voltage comparator comprising:

an N-differential amplifier having a first N-differential amplifier input for receiving the first input signal, a second N-differential amplifier input for receiving the second input signal, a first N-differential amplifier output and a second N-differential amplifier output, wherein the first N-differential amplifier output is a first current proportional to the difference between the first input signal and the second input signal, and wherein the second N-differential amplifier output is a second current proportional to the difference between the second input signal and the first input signal;

a first switch coupled in series between the N-differential amplifier and a ground and responsive to a reset input, the first switch disabling and enabling the N-differential amplifier in response to receiving the reset input;

a P-differential amplifier having a first P-differential amplifier input for receiving the first input signal, a second P-differential amplifier input for receiving the second input signal, a first P-differential amplifier output and a second P-differential amplifier output, wherein the first P-differential amplifier output is a third current proportional to the difference between the second input signal and the first input signal, and wherein the second P-differential amplifier output is a fourth current proportional to the difference between the first input signal and the second input signal;

a second switch coupled in series between the P-differential amplifier and a supply and responsive to the reset input, the second switch disabling and enabling the P-differential amplifier in response to receiving the reset input, wherein the second switch generates a switched supply;

a switched latch coupled to the N-differential amplifier and the P-differential amplifier, having a first port, and a second port, and responsive to the reset input, wherein the first port is coupled to the first N-differential amplifier output and the second P-differential amplifier output, and the second port is coupled to the second N-differential amplifier output and the first P-differential amplifier output;

a first buffer having a first buffer input coupled to the first output and having a first buffer output coupled to a first load; and a second buffer having a second buffer input coupled to the second output and having a second buffer output coupled to a second load, wherein the first output is active and the second output is inactive when the reset input is inactive and the first input is greater than the second input, and wherein the second output is active and the first output is inactive when the reset input is inactive and the second input is greater than the first input.

2. A voltage comparator for voltage comparison of a first input signal and a second input signal, and generating a first output and a second output, the voltage comparator comprising:

an N-differential amplifier having a first N-differential amplifier input for receiving the first input signal, a second N-differential amplifier input for receiving the second input signal, a first N-differential amplifier output and a second N-differential amplifier output, wherein the first N-differential amplifier output is a first current proportional to the difference between the first input signal and the second input signal, and wherein the second N-differential amplifier output is a second current proportional to the difference between the second input signal and the first input signal;

a first switch coupled in series between the N-differential amplifier and a ground and responsive to a reset input, the first switch disabling and enabling the N-differential amplifier in response to receiving the reset input;

a P-differential amplifier having a first P-differential amplifier input for receiving the first input signal, a second P-differential amplifier input for receiving the second input signal, a first P-differential amplifier output and a second P-differential amplifier output, wherein the first P-differential amplifier output is a third current proportional to the difference between the second input signal and the first input signal, and wherein the second P-differential amplifier output is a fourth current proportional to the difference between the first input signal and the second input signal;

a current load coupled to the first P-differential amplifier output and the second P-differential amplifier output;

a second switch coupled in series between the P-differential amplifier and a supply and responsive to the reset input, the second switch disabling and enabling the P-differential amplifier in response to receiving the reset input;

a switched latch coupled to the N-differential amplifier and the P-differential amplifier, having a first port, and a second port, and responsive to the reset input, wherein the first port is coupled to the first N-differential amplifier output and the second P-differential amplifier output, and the second port is coupled to the second N-differential amplifier output and the first P-differential amplifier output;

a first buffer having a first buffer input coupled to the first output and having a first buffer output coupled to a first load; and a second buffer having a second buffer input coupled to the second output and having a second buffer output coupled to a second load, wherein the first output is active and the second output is inactive when the reset input is inactive and the first input is greater than the second input, and wherein the second output is active and the first output is inactive when the reset input is inactive and the second input is greater than the first input.

* * * * *